US011289007B2

(12) United States Patent
Cheng

(10) Patent No.: US 11,289,007 B2
(45) Date of Patent: Mar. 29, 2022

(54) GOA DRIVING UNIT, GOA CIRCUIT, AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Jiangkun Cheng, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 214 days.

(21) Appl. No.: 16/494,423

(22) PCT Filed: Aug. 21, 2019

(86) PCT No.: PCT/CN2019/101739
§ 371 (c)(1),
(2) Date: Sep. 16, 2019

(87) PCT Pub. No.: WO2020/206898
PCT Pub. Date: Oct. 15, 2020

(65) Prior Publication Data
US 2021/0335211 A1    Oct. 28, 2021

(30) Foreign Application Priority Data
Apr. 8, 2019   (CN) .......................... 201910274313.9

(51) Int. Cl.
*G09G 3/32* (2016.01)

(52) U.S. Cl.
CPC ....... *G09G 3/32* (2013.01); *G09G 2300/0408* (2013.01); *G09G 2310/0267* (2013.01); *G09G 2320/0204* (2013.01); *G09G 2330/04* (2013.01)

(58) Field of Classification Search
CPC .. G09G 3/3677; G09G 3/3676; G09G 3/3696; G09G 3/20; G09G 3/32;
(Continued)

(56) References Cited

U.S. PATENT DOCUMENTS 9,633,620 B2 *   4/2017   Cao ......................... G11C 19/28
10,453,415 B2 *  10/2019  Gong ........................ G09G 3/20
(Continued)

FOREIGN PATENT DOCUMENTS

CN    102144253 A    8/2011
CN    103680451 A    3/2014
(Continued)

*Primary Examiner* — Vijay Shankar

(57) ABSTRACT

A gate on array (GOA) driving unit, a GOA circuit, and a display device are provided. The GOA driving unit includes a GOA module configured to output a low voltage-level signal through a first output end of the GOA module under the control of a first clock signal and to output a high voltage-level signal through the first output end under the control of a second clock signal, wherein the first output end is configured to output the high or low voltage-level signal to the next level of GOA driving unit; and a protective module having a control end connected to a constant direct-current signal, an input end connected to the first output end, and a second output end configured to output the high or low voltage-level signal as a gate driving signal to a corresponding pixel unit under the control of the constant direct-current signal.

7 Claims, 2 Drawing Sheets

(58) Field of Classification Search
CPC ......... G09G 3/2092; G09G 2300/0408; G09G 2310/0267; G09G 2320/0204; G09G 2330/04; G09G 2300/0426; G09G 2310/0286; G09G 2310/08; G09G 2310/06; G09G 2310/0224; G09G 2310/0291; G09G 2320/0219; G11C 19/28; G11C 19/287
See application file for complete search history.

(56) References Cited

U.S. PATENT DOCUMENTS

| | | | |
|---|---|---|---|
| 10,748,465 B2* | 8/2020 | Zou | G09G 3/3677 |
| 2011/0148825 A1 | 6/2011 | Ueno | |
| 2016/0343335 A1* | 11/2016 | Cao | G09G 3/36 |
| 2017/0261800 A1 | 9/2017 | Zhang et al. | |
| 2019/0164515 A1* | 5/2019 | Gong | G09G 3/20 |
| 2021/0174758 A1* | 6/2021 | Liu | G06F 1/06 |

FOREIGN PATENT DOCUMENTS

| | | |
|---|---|---|
| CN | 105206244 A | 12/2015 |
| CN | 105223713 A | 1/2016 |
| CN | 105244000 A | 1/2016 |
| CN | 105448260 A | 3/2016 |
| CN | 105448261 A | 3/2016 |
| CN | 105609072 A | 5/2016 |
| CN | 106384578 A | 2/2017 |
| CN | 107527601 A | 12/2017 |
| CN | 107863079 A | 3/2018 |
| CN | 108665837 A | 10/2018 |
| CN | 108766335 A | 11/2018 |
| CN | 109215557 A | 1/2019 |
| CN | 109416902 A | 3/2019 |
| CN | 109949757 A | 6/2019 |
| CN | 110070817 A | 7/2019 |
| WO | 2015024329 A1 | 2/2015 |

* cited by examiner

GOA DRIVING UNIT, GOA CIRCUIT, AND DISPLAY DEVICE

BACKGROUND OF DISCLOSURE

1. Field of Disclosure

The present disclosure relates to the field of display technology, and more particularly, to a gate on array (GOA) driving unit, a GOA circuit, and a display device.

2. Description of Related Art

With improvements in flat display technology, various products with flat display modules are applied in life. For example, smartphones, smart network televisions, etc. are popular. Higher requirements for light and thin display, narrow border, etc. are requested by consumers. Gate on array (GOA) gate driving technology can satisfy the requirement for narrow border well.

SUMMARY

A technical problem is that, in a gate on array (GOA) circuit, output signals of the previous level of GOA unit are also used as input signals of the next level of GOA unit to participate in the work of the next level of GOA unit, except being transmitted to a display area as a gate driving signal to a corresponding pixel unit.

In general, because there exists a problem of granulation in the manufacturing process of panel, this will easily lead to a flaw in the display area. Typically, for example, short circuits between a GOA output scan signal and other signals such as ELVDD, ELVSS, Vi, etc. are caused by granulation, causing the next level of input signal to be pulled down or pulled up. At this time, all GOA units below the next level of GOA unit fail to work normally, and an undesirable phenomenon of split-screen display on a panel occurs, so that functions of the panel are seriously affected.

Therefore, it is urgent to improve the deficiencies existing in conventional technologies.

The present disclosure provides a GOA driving unit, a GOA circuit, and a display device, which can avoid undesirable phenomena caused by short circuits between a GOA output end and other signals.

The present disclosure provides a GOA driving unit, including:

a GOA module configured to output a low voltage-level signal through a first output end of the GOA module under the control of a first clock signal and to output a high voltage-level signal through the first output end under the control of a second clock signal, wherein the first output end is configured to output the high voltage-level signal or the low voltage-level signal to the next level of GOA driving unit; and a protective module having a control end connected to a constant direct-current signal, an input end connected to the first output end, and a second output end configured to output the high voltage-level signal or the low voltage-level signal as a gate driving signal to a corresponding pixel unit under the control of the constant direct-current signal.

In the GOA driving unit of the present disclosure, the GOA module includes a high voltage-level output sub-module and a low voltage-level output sub-module.

The high voltage-level output sub-module is configured to output the high voltage-level signal through the first output end under the control of the second clock signal.

The low voltage-level output sub-module is configured to output the high voltage-level signal through the first output end under the control of the first clock signal.

In the GOA driving unit of the present disclosure, the high voltage-level output sub-module includes a first transistor, a second transistor, a third transistor, and a first storage capacitor.

A drain electrode of the first transistor is connected to a first low voltage-level signal VGL, a gate electrode of the first transistor is connected to the second clock signal, a source electrode of the first transistor is connected to one end of the first storage capacitor, a gate electrode of the third transistor, and a source electrode of the second transistor, the other end of the first storage capacitor is connected to a drain electrode of the third transistor and a first high voltage-level signal, a drain electrode of the second transistor is connected to the second clock signal, a gate electrode of the second transistor is connected to the low voltage-level output sub-module, and a source electrode of the third transistor is connected to the first output end.

In the GOA driving unit of the present disclosure, the low voltage-level output sub-module includes a fourth transistor, a fifth transistor, a sixth transistor, and a second storage capacitor.

A drain electrode of the fourth transistor is configured to receive a turn-on signal by being connected to a first output end of the previous level of GOA driving unit, a source electrode of the fourth transistor, the gate electrode of the second transistor, a gate electrode of the fifth transistor, and one end of the second storage capacitor are connected, a gate electrode of the fourth transistor is connected to the second clock signal, a drain electrode of the fifth transistor is connected to the first low voltage-level signal, a source electrode of the fifth transistor is connected to a drain electrode of the sixth transistor, a gate electrode of the sixth transistor is connected to the first clock signal, and a source electrode of the sixth transistor, the other end of the second storage capacitor, and the first output end are connected.

In the GOA driving unit of the present disclosure, the protective module includes a seventh transistor, a first resistor, and a second resistor, wherein a drain electrode of the seventh transistor is connected to the first output end, wherein a source electrode of the seventh transistor is connected to the second output end, wherein a gate electrode of the seventh transistor is connected to one end of the second resistor, wherein the other end of the second resistor is connected to the constant direct-current signal, wherein one end of the first resistor is connected to a common node of the seventh transistor and the second resistor, and wherein the other end of the first resistor is connected to the source electrode of the seventh transistor.

In the GOA driving unit of the present disclosure, the protective module includes a seventh transistor, a first resistor, and a second resistor, wherein a drain electrode of the seventh transistor is connected to the first output end, wherein a source electrode of the seventh transistor is connected to the second output end, wherein a gate electrode of the seventh transistor is connected to one end of the second resistor, wherein the other end of the second resistor is connected to the constant direct-current signal, wherein one end of the first resistor is connected to a common node of the seventh transistor and the second resistor, and wherein the other end of the first resistor is connected to the drain electrode of the seventh transistor.

In the GOA driving unit of the present disclosure, the protective module includes a seventh transistor, a first resistor, a second resistor, and a third resistor, wherein a drain electrode of the seventh transistor is connected to the first output end, wherein a source electrode of the seventh transistor is connected to the second output end, wherein a gate electrode of the seventh transistor is connected to one end of the second resistor, wherein the other end of the second resistor is connected to the constant direct-current signal, wherein one end of the first resistor is connected to a common node of the seventh transistor and the second resistor, wherein the other end of the first resistor is connected to the drain electrode of the seventh transistor, wherein one end of the third resistor is connected to the common node of the seventh transistor and the second resistor, and wherein the other end of the third resistor is connected to the source electrode of the seventh transistor.

In the GOA driving unit of the present disclosure, the seventh transistor is an N-type field-effect thin-film transistor.

A GOA circuit includes at least two cascading GOA driving units, wherein each of the at least two cascading GOA driving units is any one of the above GOA driving units, wherein an input signal of the first level of GOA driving unit is a frame start signal, and wherein an input signal of the n-th level of GOA driving unit is a voltage signal outputted by a first output end of the n−1-th level of GOA driving unit.

A display device includes the above GOA circuit.

The beneficial effect of the present disclosure is that, through disposing the protective module having the control end connected to the constant direct-current signal, the input end connected to the first output end, and the second output end configured to output the high voltage-level signal or the low voltage-level signal as the gate driving signal to the corresponding pixel unit under the control of the constant direct-current signal, the present disclosure can avoid undesirable phenomena caused by short circuits between a GOA output end and other signals.

BRIEF DESCRIPTION OF DRAWINGS

In order to more clearly illustrate the embodiments of the present disclosure or technical solutions in conventional technologies, the drawings required for describing of the embodiments or conventional technologies will be briefly introduced below. It is obvious that the following drawings are merely some embodiments of the present disclosure, and a person having ordinary skill in this field can obtain other drawings according to these drawings under the premise of not paying creative works.

DETAILED DESCRIPTION OF EMBODIMENTS

Figure 1:
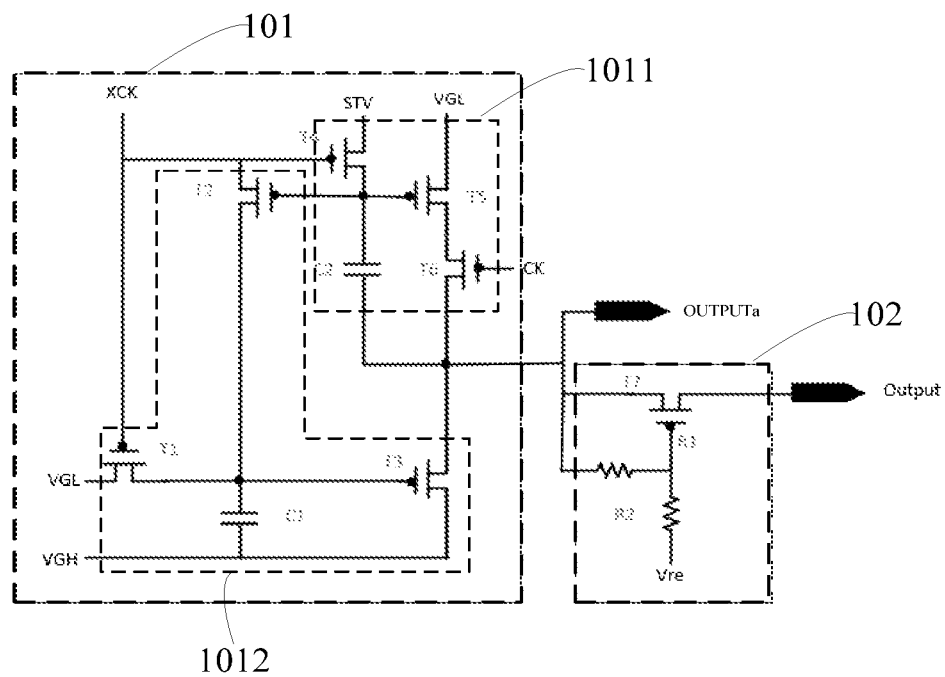
FIG. 1 is a first structural diagram of a gate on array (GOA) driving unit in some embodiments provided in the present disclosure.

The embodiments of the present disclosure are described in detail below, and their examples are shown in the accompanying drawings. The same or similar elements or elements having the same or similar functions are denoted by the same or similar reference numerals throughout the descriptions. The following embodiments referring to the accompanying drawings are illustrative and merely used for explaining the present disclosure without being regarded as a limitation to the present disclosure.

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", "clockwise", "counter-clockwise" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or a quantity of features. Thus, features limited by "first" and "second" are intended to indicate or imply including one or more than one these features. In the description of the present disclosure, "a plurality of" relates to two or more than two, unless otherwise specified.

In the description of the present disclosure, unless specified or limited otherwise, it should be noted that, terms "mounted", "interconnected" and "connected" may be understood broadly, such as permanent connection or detachable connection or integral connection, mechanical connection or electronic connection or mutual communication, direct connection or indirect connection via intermediary, inner communication or interaction between two elements. A person skilled in the art should understand the specific meanings in the present disclosure according to specific situations.

In the present disclosure, unless specified or limited otherwise, it should be noted that, a structure in which a first feature is "on" or "beneath" a second feature may include an embodiment in which the first feature directly contacts the second feature, and may also include an embodiment in which an additional feature is formed between the first feature and the second feature so that the first feature does not directly contact the second feature. Furthermore, a first feature "on", "above", or "on top of" a second feature may include an embodiment in which the first feature is right "on", "above", or "on top of" the second feature, and may also include an embodiment in which the first feature is not right "on", "above", or "on top of" the second feature, or just means that the first feature has a sea level elevation greater than the sea level elevation of the second feature. While first feature "beneath", "below", or "on bottom of" a second feature may include an embodiment in which the first feature is right "beneath", "below", or "on bottom of" the second feature, and may also include an embodiment in which the first feature is not right "beneath", "below", or "on bottom of" the second feature, or just means that the first feature has a sea level elevation less than the sea level elevation of the second feature.

The following description provides various embodiments or examples for implementing various structures of the present disclosure. To simplify the description of the present disclosure, parts and settings of specific examples are described as follows. Certainly, they are only illustrative, and are not intended to limit the present disclosure. Further, reference numerals and reference letters may be repeated in different examples. This repetition is for purposes of simplicity and clarity and does not indicate a relationship of the various embodiments and/or the settings. Furthermore, the present disclosure provides specific examples of various processes and materials, however, a person skilled in the art may be aware of applications of other processes and/or other materials.

Please refer to FIG. 1, which is a structural diagram of a gate on array (GOA) driving unit in some embodiments provided in the present disclosure.

In some embodiments, the GOA driving unit includes a GOA module 101 and a protective module 102.

The GOA module 101 is configured to output a low voltage-level signal through a first output end OUTPUTa of the GOA module 101 under the control of a first clock signal CK and to output a high voltage-level signal through the first output end OUTPUTa under the control of a second clock signal XCK. The first output end OUTPUTa is configured to output the high voltage-level signal or the low voltage-level signal to the next level of GOA driving unit.

The protective module 102 having a control end connected to a constant direct-current signal VRE, an input end connected to the first output end OUTPUTa, and a second output end OUTPUT configured to output the high voltage-level signal or the low voltage-level signal as a gate driving signal to a corresponding pixel unit under the control of the constant direct-current signal VRE.

Specifically, the GOA module 101 includes a high voltage-level output sub-module 1012 and a low voltage-level output sub-module 1011. The high voltage-level output sub-module is configured to output the high voltage-level signal through the first output end OUTPUTa under the control of the second clock signal XCK. The low voltage-level output sub-module is configured to output the high voltage-level signal through the first output end OUTPUTa under the control of the first clock signal CK.

In some embodiments, the high voltage-level output sub-module 1012 includes a first transistor T1, a second transistor T2, a third transistor T3, and a first storage capacitor C1. A drain electrode of the first transistor T1 is connected to a first low voltage-level signal VGL. A gate electrode of the first transistor T1 is connected to the second clock signal XCK. A source electrode of the first transistor T1 is connected to one end of the first storage capacitor C1, a gate electrode of the third transistor T3, and a source electrode of the second transistor T2. The other end of the first storage capacitor C1 is connected to a drain electrode of the third transistor T3 and a first high voltage-level signal VGH. A drain electrode of the second transistor T2 is connected to the second clock signal XCK. A gate electrode of the second transistor T2 is connected to the low voltage-level output sub-module. A source electrode of the third transistor T3 is connected to the first output end OUTPUTa.

In some embodiments, the low voltage-level output sub-module 1011 includes a fourth transistor T4, a fifth transistor T5, a sixth transistor T6, and a second storage capacitor C2. A drain electrode of the fourth transistor T4 is configured to receive a turn-on signal STV by being connected to a first output end OUTPUTa of the previous level of GOA driving unit. A source electrode of the fourth transistor T4, the gate electrode of the second transistor T2, a gate electrode of the fifth transistor T5, and one end of the second storage capacitor C2 are connected. A gate electrode of the fourth transistor T4 is connected to the second clock signal XCK. A drain electrode of the fifth transistor T5 is connected to the first low voltage-level signal VGL. A source electrode of the fifth transistor T5 is connected to a drain electrode of the sixth transistor T6. A gate electrode of the sixth transistor T6 is connected to the first clock signal CK. A source electrode of the sixth transistor T6, the other end of the second storage capacitor C2, and the first output end OUTPUTa are connected.

In some embodiments, the protective module 102 includes a seventh transistor T7, a first resistor R1, and a second resistor R2. A drain electrode of the seventh transistor T7 is connected to the first output end OUTPUTa. A source electrode of the seventh transistor T7 is connected to the second output end OUTPUT. A gate electrode of the seventh transistor T7 is connected to one end of the second resistor R2. The other end of the second resistor R2 is connected to the constant direct-current signal VRE. One end of the first resistor R1 is connected to a common node of the seventh transistor T7 and the second resistor R2. The other end of the first resistor R1 is connected to the source electrode of the seventh transistor T7. The first resistor R1 and the second resistor R2 are voltage-divider resistors. In a practical manufacturing process, the first resistor R1 and the second resistor R2 can be both made of metal, a-Si, Poly-Si, or other material. The circuit adjusts a conducting state and a cut-off state of the seventh transistor T7 through a Vout detecting circuit with a feedback to the gate electrode of the seventh transistor T7. The voltage VGS of the seventh transistor T7 is calculated according to the formula: (VOUTPUTa−Vre)*R1/(R1+R2). After the values of Vre, R1, and R2 are set, the voltage VGS vary in accordance with the changing VOUTPUTa, and the working state of the seventh transistor T7 is controlled.

Figure 2:
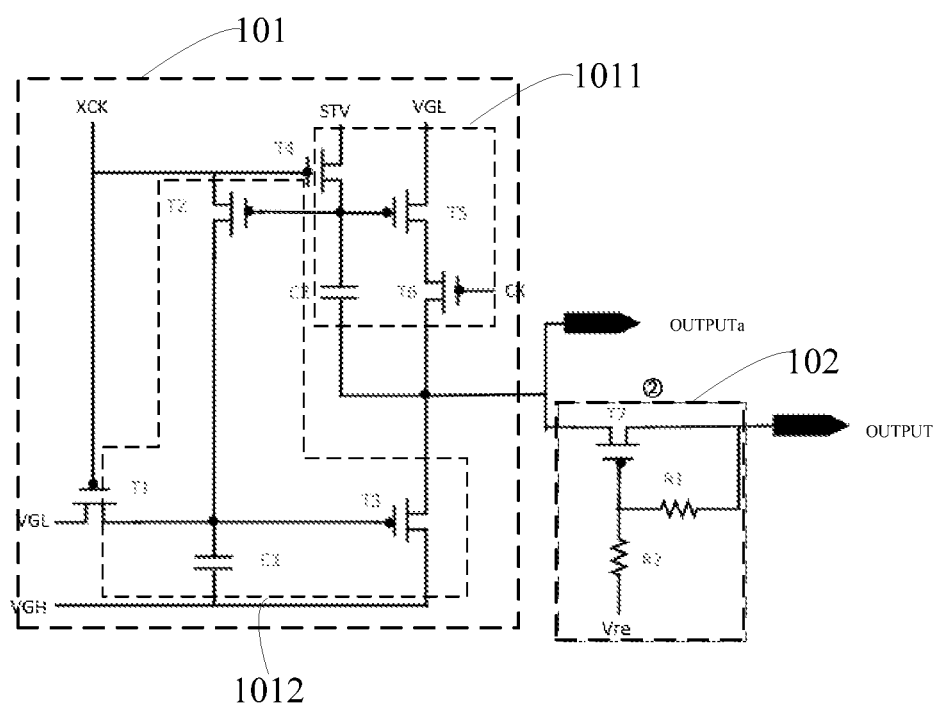
FIG. 2 is a second structural diagram of a GOA driving unit in some embodiments provided in the present disclosure.

It can be realized that the protective module can be adjusted as the following in accordance with differences of output waveform of GOA circuit, such as EM GOA, etc. As shown in FIG. 2, the protective module 102 further includes the seventh transistor T7, the first resistor R1, and the second resistor R2. The drain electrode of the seventh transistor T7 is connected to the first output end OUTPUTa. The source electrode of the seventh transistor T7 is connected to the second output end OUTPUT. The gate electrode of the seventh transistor T7 is connected to one end of the second resistor R2. The other end of the second resistor R2 is connected to the constant direct-current signal VRE. One end of the first resistor R1 is connected to the common node of the seventh transistor T7 and the second resistor R2. The other end of the first resistor R1 is connected to the drain electrode of the seventh transistor T7.

Figure 3:
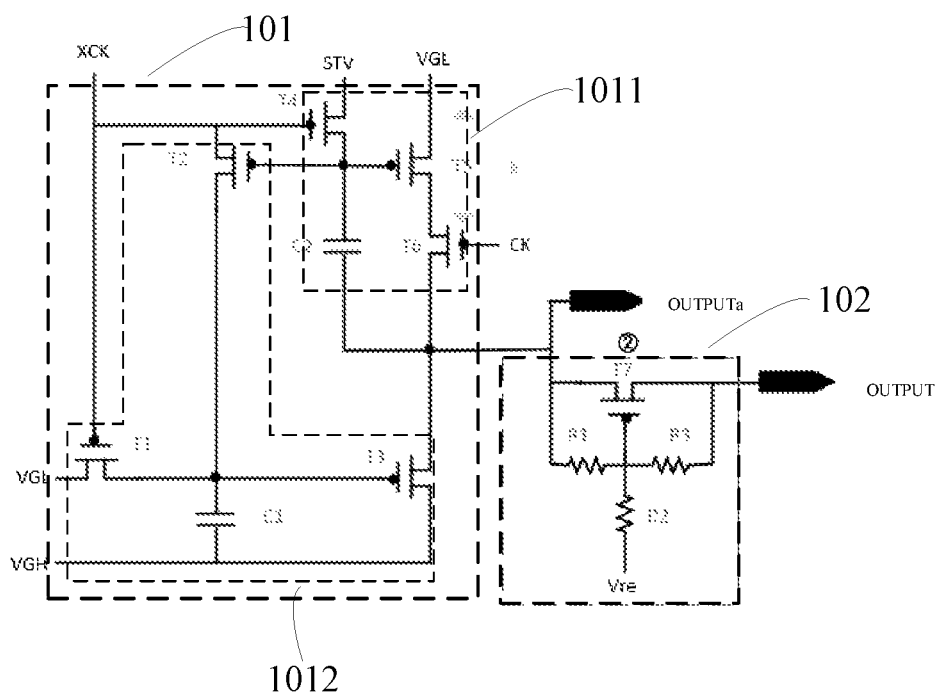
FIG. 3 is a third structural diagram of a GOA driving unit in some embodiments provided in the present disclosure.

It can be realized that the protective module can be adjusted as the following in accordance with differences of output waveform of GOA circuit, such as EM GOA, etc. As shown in FIG. 3, the protective module 102 further includes the seventh transistor T7, the first resistor R1, the second resistor R2, and a third resistor R3. The drain electrode of the seventh transistor T7 is connected to the first output end OUTPUTa. The source electrode of the seventh transistor T7 is connected to the second output end OUTPUT. The gate electrode of the seventh transistor T7 is connected to one end of the second resistor R2. The other end of the second resistor R2 is connected to the constant direct-current signal VRE. One end of the first resistor R1 is connected to the common node of the seventh transistor T7 and the second resistor R2. The other end of the first resistor R1 is connected to the drain electrode of the seventh transistor T7. One end of the third resistor R3 is connected to the common node of the seventh transistor T7 and the second resistor R2, and the other end of the third resistor R3 is connected to the source electrode of the seventh transistor T7.

The seventh transistor T7 is an N-type field-effect thin-film transistor.

Figure 4:
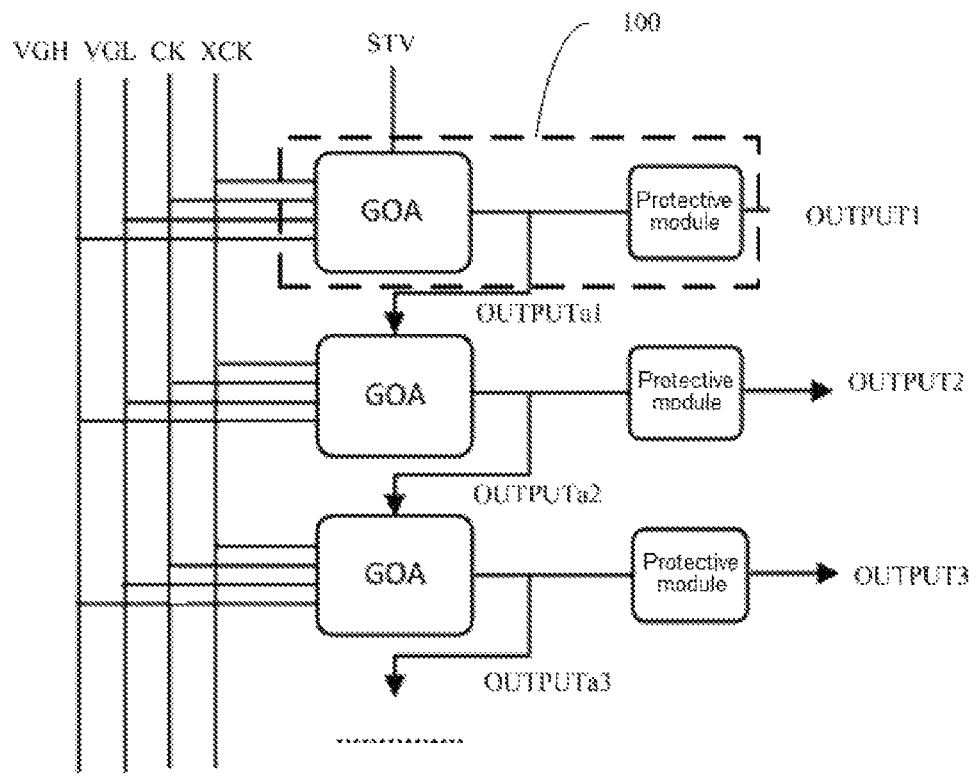
FIG. 4 is a structural diagram of a GOA circuit provided in the present disclosure.

Please refer to FIG. 4, the present disclosure further provides a GOA circuit. The GOA circuit includes at least two cascading GOA driving units 100. Each of the at least two cascading GOA driving units 100 is any one of the above GOA driving units 100. An input signal of the first level of GOA driving unit 100 is a frame start signal, and an input signal of the n-th level of GOA driving unit 100 is a voltage signal outputted by the first output end OUTPUTa of the n−1-th level of GOA driving unit 100.

The present disclosure further provides a display device including the above GOA circuit.

Through disposing the protective module having the control end connected to the constant direct-current signal, the input end connected to the first output end, and the second output end configured to output the high voltage-level signal or the low voltage-level signal as the gate driving signal to the corresponding pixel unit under the control of the constant direct-current signal, the present disclosure can avoid undesirable phenomena caused by short circuits between a GOA output end and other signals.

In conclusion, although the present disclosure has been described with reference to the foregoing preferred embodiments thereof, it is not limited to the foregoing preferred embodiments. It is apparent to those skilled in the art that a variety of modifications and changes may be made without departing from the scope of the present disclosure which is intended to be defined by the appended claims.

The industrial applicability of the present disclosure is that, the topic of the application can be manufactured and used so that it has an industrial practicality.

What is claimed is:

1. A GOA driving unit, comprising:
a GOA module configured to output a low voltage-level signal through a first output end of the GOA module under the control of a first clock signal and to output a high voltage-level signal through the first output end under the control of a second clock signal, wherein the first output end is configured to output the high voltage-level signal or the low voltage-level signal to the next level of GOA driving unit, wherein the GOA module comprises a high voltage-level output sub-module and a low voltage-level output sub-module, wherein the high voltage-level output sub-module is configured to output the high voltage-level signal through the first output end under the control of the second clock signal, and wherein the low voltage-level output sub-module is configured to output the high voltage-level signal through the first output end under the control of the first clock signal; and
a protective module having a control end connected to a constant direct-current signal, an input end connected to the first output end, and a second output end configured to output the high voltage-level signal or the low voltage-level signal as a gate driving signal to a corresponding pixel unit under the control of the constant direct-current signal; and
wherein the high voltage-level output sub-module comprises a first transistor, a second transistor, a third transistor, and a first storage capacitor, wherein a drain electrode of the first transistor is connected to a first low voltage-level signal VGL, wherein a gate electrode of the first transistor is connected to the second clock signal, wherein a source electrode of the first transistor is connected to one end of the first storage capacitor, a gate electrode of the third transistor, and a source electrode of the second transistor, wherein the other end of the first storage capacitor is connected to a drain electrode of the third transistor and a first high voltage-level signal, wherein a drain electrode of the second transistor is connected to the second clock signal, wherein a gate electrode of the second transistor is connected to the low voltage-level output sub-module, and wherein a source electrode of the third transistor is connected to the first output end; and
wherein the low voltage-level output sub-module comprises a fourth transistor, a fifth transistor, a sixth transistor, and a second storage capacitor, wherein a drain electrode of the fourth transistor is configured to receive a turn-on signal by being connected to a first output end of the previous level of GOA driving unit, wherein a source electrode of the fourth transistor, the gate electrode of the second transistor, a gate electrode of the fifth transistor, and one end of the second storage capacitor are connected, wherein a gate electrode of the fourth transistor is connected to the second clock signal, wherein a drain electrode of the fifth transistor is connected to the first low voltage-level signal, wherein a source electrode of the fifth transistor is connected to a drain electrode of the sixth transistor, wherein a gate electrode of the sixth transistor is connected to the first clock signal, and wherein a source electrode of the sixth transistor, the other end of the second storage capacitor, and the first output end are connected.

2. The GOA driving unit of claim 1, wherein the protective module comprises a seventh transistor, a first resistor, and a second resistor, wherein a drain electrode of the seventh transistor is connected to the first output end, wherein a source electrode of the seventh transistor is connected to the second output end, wherein a gate electrode of the seventh transistor is connected to one end of the second resistor, wherein the other end of the second resistor is connected to the constant direct-current signal, wherein one end of the first resistor is connected to a common node of the seventh transistor and the second resistor, and wherein the other end of the first resistor is connected to the source electrode of the seventh transistor.

3. The GOA driving unit of claim 1, wherein the protective module comprises a seventh transistor, a first resistor, and a second resistor, wherein a drain electrode of the seventh transistor is connected to the first output end, wherein a source electrode of the seventh transistor is connected to the second output end, wherein a gate electrode of the seventh transistor is connected to one end of the second resistor, wherein the other end of the second resistor is connected to the constant direct-current signal, wherein one end of the first resistor is connected to a common node of the seventh transistor and the second resistor, and wherein the other end of the first resistor is connected to the drain electrode of the seventh transistor.

4. The GOA driving unit of claim 1, wherein the protective module comprises a seventh transistor, a first resistor, a second resistor, and a third resistor, wherein a drain electrode of the seventh transistor is connected to the first output end, wherein a source electrode of the seventh transistor is connected to the second output end, wherein a gate electrode of the seventh transistor is connected to one end of the second resistor, wherein the other end of the second resistor is connected to the constant direct-current signal, wherein one end of the first resistor is connected to a common node of the seventh transistor and the second resistor, wherein the other end of the first resistor is connected to the drain electrode of the seventh transistor, wherein one end of the third resistor is connected to the common node of the seventh transistor and the second resistor, and wherein the other end of the third resistor is connected to the source electrode of the seventh transistor.

5. The GOA driving unit of claim 4, wherein the seventh transistor is an N-type field-effect thin-film transistor.

6. A GOA circuit, comprising:

at least two cascading GOA driving units, wherein each of the at least two cascading GOA driving units is the GOA driving unit of claim 1, wherein an input signal of the first level of GOA driving unit is a frame start signal, and wherein an input signal of the n-th level of GOA driving unit is a voltage signal outputted by a first output end of the n−1-th level of GOA driving unit.

7. A gate on array (GOA) driving unit, comprising:

a GOA module configured to output a low voltage-level signal through a first output end of the GOA module under the control of a first clock signal and to output a high voltage-level signal through the first output end under the control of a second clock signal, wherein the first output end is configured to output the high voltage-level signal or the low voltage-level signal to the next level of GOA driving unit, wherein the GOA module comprises a high voltage-level output sub-module and a low voltage-level output sub-module, wherein the high voltage-level output sub-module is configured to output the high voltage-level signal through the first output end under the control of the second clock signal, and wherein the low voltage-level output sub-module is configured to output the high voltage-level signal through the first output end under the control of the first clock signal; and a protective module having a control end connected to a constant direct-current signal, an input end connected to the first output end, and a second output end configured to output the high voltage-level signal or the low voltage-level signal as a gate driving signal to a corresponding pixel unit under the control of the constant direct-current signal, wherein the protective module comprises a seventh transistor, a first resistor, and a second resistor, wherein a drain electrode of the seventh transistor is connected to the first output end, wherein a source electrode of the seventh transistor is connected to the second output end, wherein a gate electrode of the seventh transistor is connected to one end of the second resistor, wherein the other end of the second resistor is connected to the constant direct-current signal, wherein one end of the first resistor is connected to a common node of the seventh transistor and the second resistor, and wherein the other end of the first resistor is connected to the source electrode of the seventh transistor.

\* \* \* \* \*